United States Patent [19]
Bushman

[11] Patent Number: 5,726,798
[45] Date of Patent: Mar. 10, 1998

[54] METHOD AND APPARATUS FOR FILTER INFRARED EMISSION

[75] Inventor: Boyd B. Bushman, Lewisville, Tex.

[73] Assignee: Lockheed Corporation, Fort Worth, Tex.

[21] Appl. No.: 566,189

[22] Filed: Dec. 1, 1995

Related U.S. Application Data

[63] Continuation-in-part of Ser. No. 293,472, Aug. 19, 1994, abandoned.

[51] Int. Cl.⁶ .................. G02B 5/08; G02B 5/28
[52] U.S. Cl. .......... 359/359; 359/350; 359/589; 136/257; 250/504 R
[58] Field of Search ............... 359/350, 359, 359/589; 250/493.1, 495.1, 338.1, 339.01, 339.06, 339.11, 504 R; 372/7; 136/253, 254, 257, 261

[56] References Cited

U.S. PATENT DOCUMENTS 3,523,179  8/1970  Edwards et al. ............ 359/589

OTHER PUBLICATIONS

Oriel Corporation, "Optics and Filters", vol. 111 Catalog, 1990.

Primary Examiner—Paul M. Dzierzinski
Assistant Examiner—Darren E. Schuberg
Attorney, Agent, or Firm—James E. Bradley

[57] ABSTRACT

A method and apparatus are provided for emitting a laser like monochromatic narrow beam of light at a selected wavelength from a heated emitter member having a plurality of parallel layers while reducing emission at other wavelengths of light. The parallel layers are overlaid with each other. Each of the parallel layers extends transversely for a particular width. A heat source stimulates the emitter member to emit photons, which are determined by the composition of materials within the emitter member. The emitter member emits monochromatic light at a selected wavelength in response to the photon emissions. The selected wavelength of the monochromatic light is determined by the width of the layers of the emitter member. Light at other wavelengths does not transmit through and their emissivity also decreases. A preferred embodiment of the present invention has an emitter member with the parallel layers having a width of one-quarter of the selected wavelength, which is within the infrared portion of the light spectrum.

14 Claims, 8 Drawing Sheets

METHOD AND APPARATUS FOR FILTER INFRARED EMISSION

CROSS-REFERENCE TO RELATED APPLICATIONS

This application is a continuation-in-part of earlier application Ser. No. 08/293,472, filed on Aug. 19, 1994, now abandoned, entitled "Method and Apparatus For Filter Infrared Emission."

BACKGROUND OF THE INVENTION

1. Field of the Invention

This invention relates in general to devices for producing light emissions over a narrow range of wavelengths, and in particular to a device for emitting light at a predetermined wavelength.

2. Description of the Prior Art

Prior art devices for emitting light have been stimulated to emit photons of light by application of heat, electricity, or other types of radiation, such as beta rays. These prior art devices are comprised of materials having particular chemical compositions which emit photons of light when electrons included within the materials change from one energy state, or quantum level, within the material to another energy state within the material. The difference between one energy state within the material and another energy state, between which an electron moves when a photon is emitted, determines the wavelength of the emitted photon. In this manner, the wavelengths at which light is emitted from such materials are determined by the different energy states, or quantum levels, for the electrons within the material components. The compositions of materials within these prior art devices determine the different quantum energy levels between which the electrons move when photons are emitted from these materials. Thus, the composition of these materials determines the wavelengths at which prior art devices emit light.

Prior art filters have been provided for selectively passing particular wavelengths of emitted light through the filter media. Prior art filters typically pass only the light of a particular, selected wavelength, and reflect light of other wavelengths. Prior art filters have been provided by one-quarter wavelength filters, which have a structure defined by providing widths, or optical thicknesses, of layers which extend for one-quarter of a selected wavelength between boundaries separating the layers. The selected wavelength is the wavelength for the light which is to be selectively passed through the filter.

One such typical one-quarter wavelength filter is produced by Optical Coating Laboratories, Inc., located at 2789 N. Point Parkway, Santa Rosa, Calif. Such optical filters are commercially available from other optical coating companies. Typically, the layers are applied by a sputtering process to provide for close tolerances for the widths, or optical thicknesses, of the layers. These one-quarter wavelength filters are used for filtering light passing therethrough, and not for stimulating to emit light.

With the optical thickness of the layers at one-quarter wavelength of selected wavelength for emissions, destructive interference occurs between alternating layers for the reflected light at the selected wavelength so that substantially none of the light at the selected wavelength is reflected from the filter. Further, at ambient temperatures these types of filters do not emit light caused by internal photon emission of the filter in the infrared spectrum. Thus, according to Kirchoff's law as applied to light, which states that the sum of the coefficients for transmissivity, reflectivity and emissivity are equal to one, light at the selective wavelength is passed through filter, while light at the other wavelengths is not passed through filter.

SUMMARY OF THE INVENTION

A method and apparatus are provided for emitting a laser-like monochromatic narrow beam of light at a selected wavelength from a heated emitter member having a plurality of parallel layers while reducing emission at other wavelengths of light. The parallel layers are overlaid with each other. Each of the parallel layers extends transversely for a particular width. A heat source stimulates the emitter member to emit photons, which are determined by the composition of materials within the emitter member. The emitter member emits monochromatic light at a selected wavelength in response to the photon emissions. The selected wavelength of the monochromatic light is determined by the optical thickness of the layers of the emitter member. Light at other wavelengths does not transmit through and their emissivity also decreases. A preferred embodiment of the present invention has an emitter member with the parallel layers having an optical thickness of one-quarter of the selected wavelength, which is within the infrared portion of the light spectrum.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of illustrative embodiments when read in conjunction with the accompanying drawings, wherein:

DETAILED DESCRIPTION OF THE INVENTION

Figure 1:
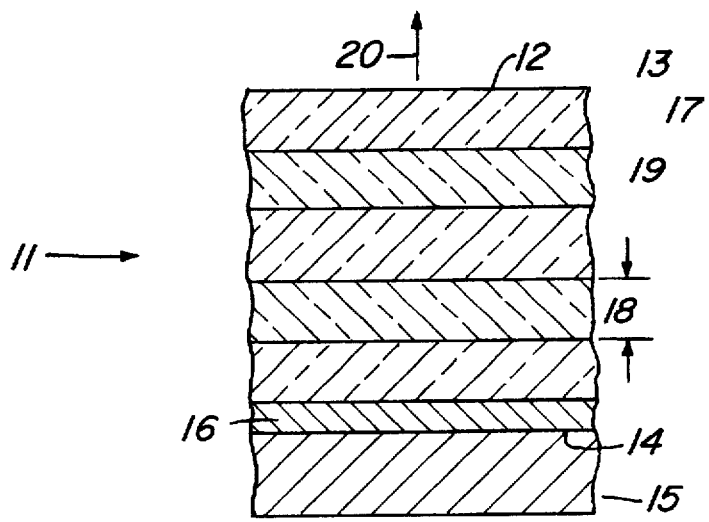
FIG. 1 is a sectional view which schematically illustrates an emitter of the present invention.

With reference now to the figures and in particular with reference to FIG. 1, a sectional view schematically depicts emitter apparatus 11 of the present invention. Apparatus 11 includes emitter member 13 and energy source 15. Emitter member 13 has face 12 and backside 14. In the preferred embodiment of the present invention, energy source 15 is provided by a heater which provides a means for stimulating photon emissions within emitter member 13. However, it should be noted that other energy sources may be used for stimulating photon emissions such as electrical currents and voltages, beta rays, and other forms of radiation.

Emitter member 13 includes substrate 16 and layers 17, which have parallel interfaces 19 with each other. Layers 17 alternate between two materials of different index of refractions, layers 17a and 17b. In the preferred embodiment layer 17a is germanium and layer 17b is silicon oxide. Preferably the value for the index of refraction of one material is equal to the square root of the value for the index of refraction of the other material. In the preferred embodiment, sapphire is used as the material to provide substrate 16, on which germanium and silicon oxide are sputtered to provide layers 17a and 17b, respectively. Substrate 16 defines backside 14 for emitter member 13.

Each of the alternating layers 17a and 17b has a width 18 or optical thickness. In the preferred embodiment of the present invention, optical thickness 18 is the same for each of layers 17a and 17b. Optical thickness 18 was selected to be one-quarter of the wavelength for light 20 to be emitted. Light passing through a boundary between alternating layers 17a and 17b of different indexes of refraction is at least in part refracted, and at least in part reflected. Transmitted light will be at one wavelength while the rest of the wavelengths will not transmit nor emit through the filter.

Operation of apparatus 11 is now described. Power is provided to energy source 15, which heats emitter member 13 to stimulate photon emissions. Photon emissions may be provided by either substrate 16, layers 17, or any combination thereof. Light 20 is then emitted having a wavelength which defines a spectral peak for the emitted light having a wavelength which is four times optical thickness 18 of layers 17. Light emission 20 is a near monochromatic, narrow beam of light, which is emitted essentially perpendicular to face 12. The following discusses various embodiments of the present invention within which emitter member 13 may be utilized to provide light emissions of a selected wavelength.

Figure 2:
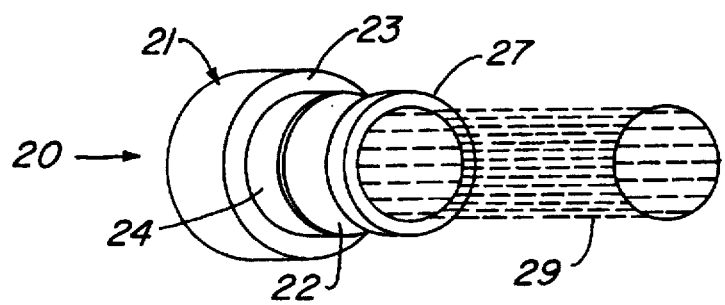
FIG. 2 is an exploded view of an apparatus of the present invention.

FIG. 2 depicts an exploded view of emitter unit 20 of the present invention. Housing 21 includes thermal insulation 23 and heater 24. A mirror 22 is placed within housing 21, next to emitter member 27. In some embodiments, a mirrored surface may extend around the circumferential periphery of emitter member 27.

Figure 3:
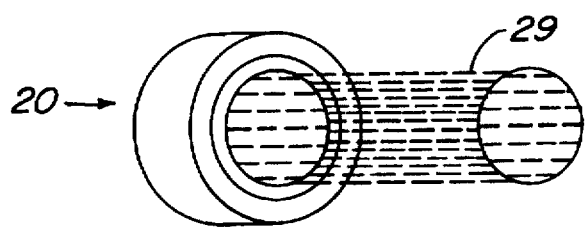
FIG. 3 is an assembled view of the apparatus of FIG. 2.

FIG. 3 depicts an assembled emitter apparatus 20 of FIG. 2. Emitter member 27 is heated until a monochromatic beam 29 is emitted at a wavelength which is four times the optical thickness, or width, of the parallel layers of emitter member 27.

Figure 4:
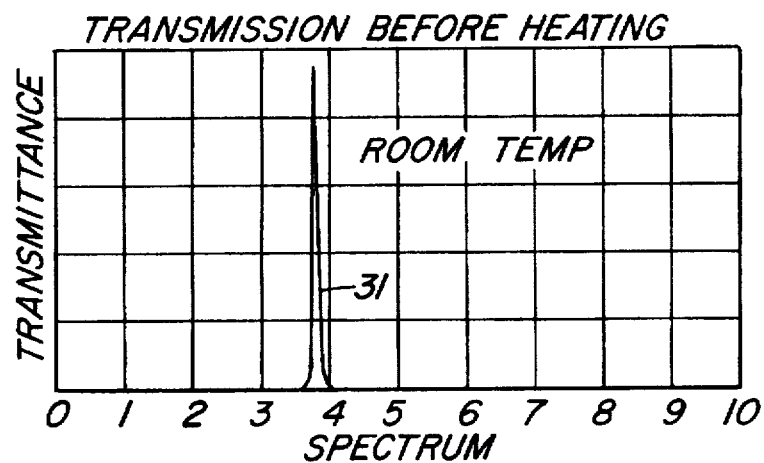
FIG. 4 is a graph of transmittance versus spectral wavelengths for depicting transmission of light of a selected wavelength through an emitter member of the present invention when at room temperature.

FIG. 4 is a graph of transmittance versus spectral wavelengths, and line 31 depicts transmission of light at a selected wavelength through emitter member 27 when emitter member 27 is at room temperature. It should be noted that emitter member 27 passes light at around 3.8 microns (micrometers) at room temperature. It should also be noted that FIG. 4 depicts light transmittance through emitter member 27, and that emitter member 27 does not emit light at room temperatures.

Figure 5:
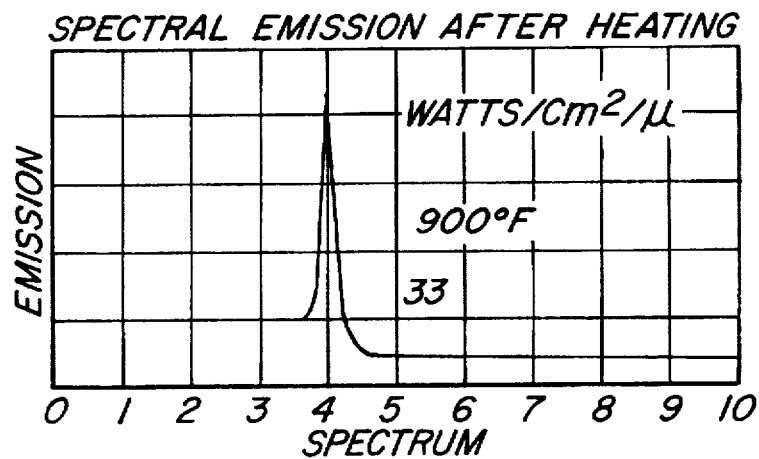
FIG. 5 is a graph of emission versus spectral energy for depicting the spectral emission of an emitter member of the present invention after being heated to 900 degrees Fahrenheit.

FIG. 5 is a graph of emission versus spectral energy, and depicts the spectral emissions 33 of an emitter member of the present invention after being heated to 900 degrees Fahrenheit. It should be noted that the spectral emission peak has shifted to 4 microns, which is due to thermal expansion of the optical thicknesses of the parallel layers within emitter 27. Emissions at the spectral energies depicted above the spectral peak at 4 microns are general background emissions.

A prototype of emitter members 13 and 27 of the present invention was tested for providing light emissions of a selected wavelength within the infrared region of the light spectrum, by heating to 900 degrees Fahrenheit a one-quarter wavelength filter available from Optical Coating Laboratories, Inc., disclosed above, having 36 alternating layers of silicon oxide and germanium coated onto a sapphire substrate. Only light at the selected wavelength was emitted from the face of emitter member 13. For purposes of the experiment, an aluminum mirror was placed on one side of the prototype emitter, next to the sapphire substrate, as shown in FIG. 2, to assure that light emissions would only come from within the emitter and not from an external heat source.

The prototype emitter of the experiment was similar to the emitter 13 which is schematically depicted in FIG. 1, except that the prototype emitter had 36 layers rather than the 5 layers illustrated for emitter member 13. The following discusses the prototype emitter in reference to FIG. 1, with the numerals placed in parenthesis after components of prototype emitter (13) being used to refer to the corresponding components of the emitter 13 which is schematically depicted in FIG. 1.

Prototype emitter (13) was approximately 1 inch in diameter and ⅛ inches thick, and had a sapphire substrate (16) onto which was sputtered 36 alternating layers of germanium (17a) and silicon oxide (17b). Each of prototype layers (17a) and (17b) had an optical thickness (18) at room temperatures which was approximately equal to one-quarter of 3.8 microns (micrometers), about 0.95 microns. The aluminum mirror was a sheet of glass coated with a reflective layer of aluminum, and the aluminum side of the mirror was placed along the backside (14) of the prototype emitter member (13), with the layer of aluminum extending between sapphire substrate (16) and the sheet of glass. The mirror was positioned adjacent to the sapphire substrate and extended fully across the end of the substrate, in the same manner as the heat source 15 depicted in FIG. 1 extends fully across the end of substrate 16 of FIG. 1.

The prototype emitter (13) and mirror were placed within a heating unit with a viewing port. Emitter (13) was positioned so that the face (12) of prototype emitter (13) was disposed to face the open viewing port of the heating unit. The prototype emitter (13) was then heated to 900 degrees Fahrenheit with an electric heat source. Light emissions from the face (12) of the emitter (13) were then detected through the view port while the temperature of prototype emitter (13) was maintained at 900 degrees Fahrenheit. Light emissions were detected with an infrared spectrometer placed in front of the viewing port. The detected light emissions were substantially the same as that shown in FIG. 5, that is, the light emission had as spectral peak at approximately 4 microns, four times the optical thickness of the the alternating layers (17a, 17b). The monochromatic energy peak measured was of an intensity corresponding to 88% of the intensity of theoretical black-body emissions at a temperature of 900 degrees Fahrenheit.

Since a mirror was placed on the backside, (14) of the prototype emitter, the only materials which could generate light of any appreciable quantity to supply the detected light emissions were the aluminum (in the mirror), sapphire (the substrate material), germanium and silicon oxide (the alternating layers). However, none of these materials have the quantum energy levels for emitting light emission spikes at 4 microns of any appreciable intensities.

Further, according to Kirchoff's law, as set forth above in the section entitled "Description of the Prior Art," these materials will not emit at this 4 micron wavelength with an intensity which is anywhere near 88% of the intensity of theoretical black-body emissions since they are either highly reflective (polished aluminum) or highly transmissive (sapphire, germanium and silicon oxide) at 900 degrees Fahrenheit. Since reflectivity is very high for aluminum, and since transmissivity is very high for sapphire, germanium and silicon oxide, their emissivity would be very low as compared to a theoretical black-body. Thus, the materials within the prototype emitter member would not emit with a significant enough intensity at a wavelength of 4 microns to produce the spectral readings actually produced, which were at 88% of the intensity of theoretical black-body emissions at 900 degrees Fahrenheit.

The near monochromatic light emissions resulted from a combination of heating the sapphire substrate and the alternating layers, and the structure of the alternating layers of germanium and silicon oxide. The spectral peak of 4 microns corresponds to the thicknesses of each of the 36 alternating layers of silicon oxide and germanium, and not to emissions from the particular materials included within the emitter member. Thus, the near monochromatic light emissions coming from the face of the prototype emitter member resulted from light emissions occurring within the emitter, and were emitted at a monochronic wavelength which corresponds to the structure of the alternating layers.

Alternative embodiments of the filter substrate of the present invention may be formed of different materials than those from which emitter member 13 is formed. Alternative embodiments to substrate 16 of FIG. 1 may include use of either quartz, glass, silicon or germanium in place of sapphire. Sapphire is preferable for use as a substrate over a range of light emissions having wavelengths between 2 and 6 microns. For light emissions having wavelengths which range from the visible range, 0.4 microns, to 2 microns, quartz, or glass may be used. Silicon may also used as a substrate material in place of sapphire for near monochromatic light emissions having wavelengths which range from 2 to 6 microns. For light emissions having wavelengths which range from 6 to 10 microns, germanium is preferable to sapphire for use as a substrate material.

Alternating layers 17a and 17b, shown in FIG. 1, may also be provided by other materials. Germanium and silicon oxide are preferable over other materials for light emissions having wavelengths which range from 2 to 8 microns. For light emissions with wavelengths ranging between the visible range, 0.4 microns, and 2 microns, magnesium fluoride and silicon oxide are preferred. For light emissions ranging from 8 to 12 microns, alternating layers of germanium and zinc sulfide are preferably used to provide layers 17a and 17b of FIG. 1.

Figure 6:
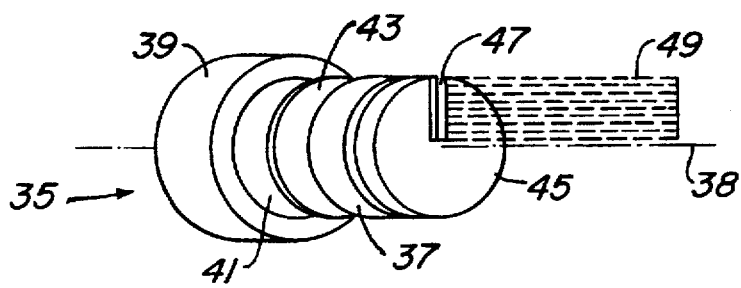
FIG. 6 is an exploded view of a calibration filter wheel of the present invention.

FIG. 6 is an exploded view of calibration filter wheel 35 of an alternative embodiment the present invention. Spectral filter wheel 35 includes wedge-shaped filter 37, having layers of varying thicknesses across different radial orientations of the spectral filter wheel 35. It should be noted that along the different radii of spectral filter wheel 35, the thickness of the layers will be uniformly the same throughout the depth of the filter wheel at that particular radii. Wedge-shaped filter wheel 37 may be rotated about central axis 38. Housing 39 provides a cooled container within which heat source 41 is contained. Mirror 43 provides a reflective surface for placing next to the backside of wedge-shaped filter 37. Cover plate 45 includes a slit 47 which is stationary with respect to housing 39, as wedge-shaped filter 37 is rotated about central axis 38 and with respect to housing 39 to align uniform thicknesses of a selected width, at a selected radial position of wedge-shaped filter 37, with slit 47 to select a wavelength for light emissions 49 passing through slit 47.

Figure 7:
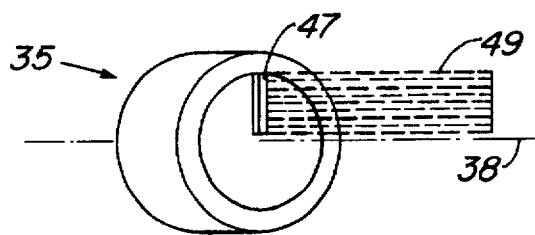
FIG. 7 is an assembled view of the calibration filter wheel of FIG. 6.

FIG. 7 is an assembled view of calibration filter wheel 36 of FIG. 6. Light emissions 49 pass through slit 47, at a selected wavelength according to the alignment of wedge-shaped filter wheel 37 with slit 47 in cover plate 45.

Figure 8:
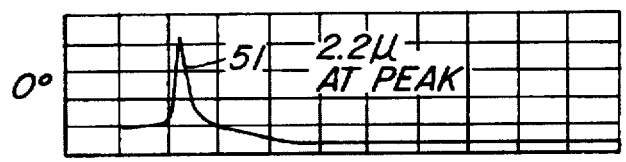
FIGS. 8 through 12 are graphs of the spectral emissions for different settings of the calibrated filter wheel of FIGS. 6 and 7.

FIG. 8 through 12 depict different wavelengths of light emissions from spectral filter wheel 35, for different placements of wedge-shaped filter 37 with respect to slit 47 in cover plate 45. FIG. 8 depicts a thinner section of wedge-shaped filter 37 aligned with slit 47, which herein is selected to be 0 degrees orientation. A spectral peak 51 for infrared emissions occurs at 2.2 microns.

It should be noted that although the present application herein refers to spectral emissions having a particular wavelength, they are actually spectral peaks having widths defined, in part, by tolerances of the optical thicknesses of parallel layers within the various filter members which are heated for emitting light at the selected wavelength.

Figure 9:
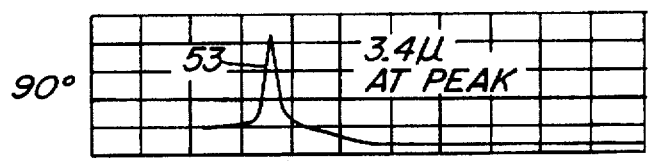

Referring to FIG. 9, after rotating wedge-shaped filter 37 with respect to cover plate 45 and slit 47 for 90 degrees, uniform optical thicknesses within filter member 37 are aligned with slit 47 for emitting light through slit 47 having a spectral peak 53 at 3.4 microns, which is within the infrared spectrum.

Figure 10:
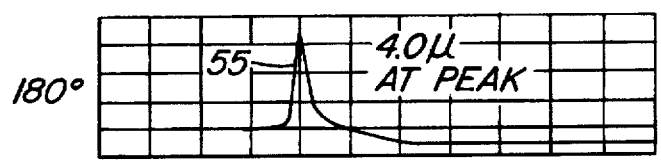
Figure 11:
Figure 12:
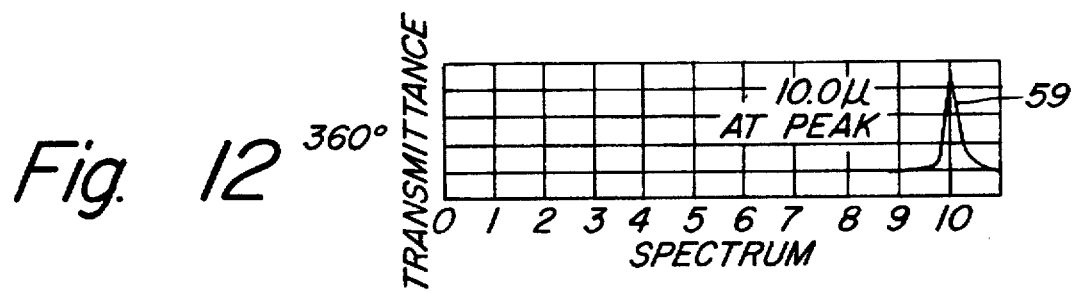

FIGS. 10, 11, and 12 depict orientations of rotation about central axis 38 for wedge-shaped filter 37 of 180 degrees, 270 degrees and 360 degrees, respectively, for passing light emissions at spectral peak 55 of 4.0 microns, spectral peak 57 of 5.0 microns and spectral peak 59 of 10.0 microns, respectively, through slit 47. These light emissions are also within the infrared light spectrum. Thus, alignment of wedge-shaped filter 37 layers of a particular with slit 47 in cover plate 45 passes light at a particular wavelength, or spectral peak, through slit 47.

Figure 13:
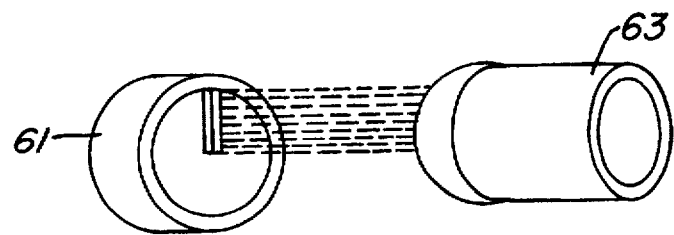
FIG. 13 is a schematic diagram illustrating use of a calibration unit of the present invention to spectrally calibrate an infrared detection unit.

FIG. 13 is a schematic diagram illustrating use of a calibration source 61 of the present invention to calibrate infrared spectrometer detector 63. A calibrated filter infrared emitter unit, such as that provided by spectral filter wheel 35, of FIGS. 6 and 7, or a unit such as that depicted in FIGS. 2 and 3, may be utilized for infrared calibration source 61. Infrared calibration source 61 of the present invention is used for calibrating infrared detector 63 for a particular wavelength of infrared emissions.

Figure 14:
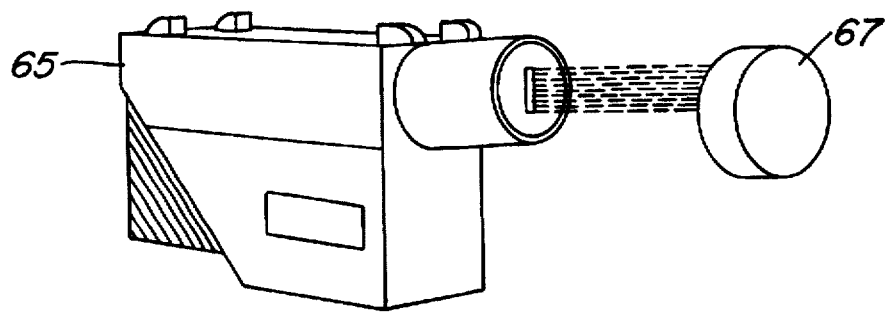
FIG. 14 is a perspective view which schematically depicts spectral calibration of an infrared FLIR detector calibration using an apparatus of the present invention.

Figure 14 is a perspective view which schematically depicts calibration of infrared FLIR detector 65 using apparatus 67 of the present invention. Calibration apparatus 67 may comprise a spectral filter wheel, such as spectral filter wheel 35 of FIGS. 6 and 7, and may be utilized to provide particular infrared emissions at varying spectral peaks, such as those shown in FIGS. 8 through 12, to calibrate FLIR detector 65.

Figure 15:
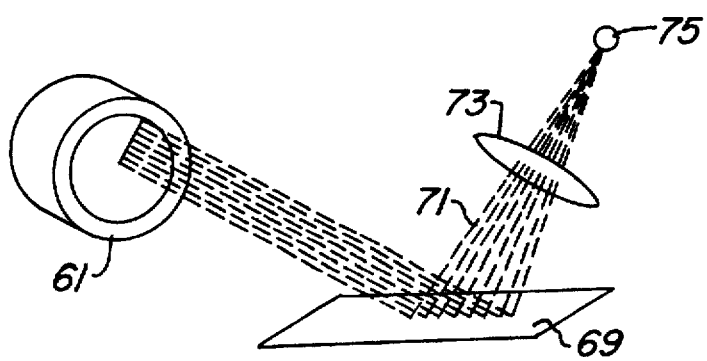
FIG. 15 is a perspective view which schematically depicts use of the present invention for obtaining surface spectral reflectivity measurements.

FIG. 15 is a perspective view which schematically depicts use of the present invention for detecting surface reflectance measurements. A surface 69 receives infrared emissions and reflects reflected light 71. Lens 73 receives reflected light 71 and directs reflected light 71 to detector 75. Detector 75 then measures the infrared spectra received from lens 73. This type of surface reflectance measurements can be used for such purposes as determining the roughness of surfaces for finished parts, or the compositions of various coatings such as paint.

Figure 16:
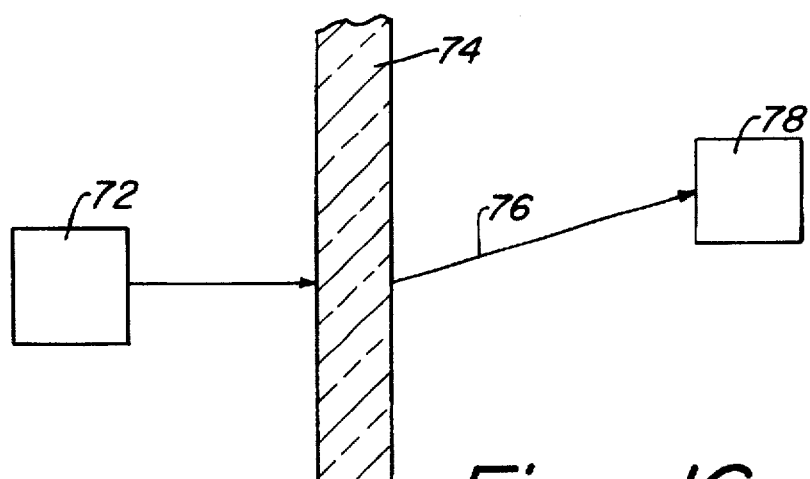
FIG. 16 is a perspective view which schematically depicts use of the present invention for detecting transmissivity of a transmissive member.

FIG. 16 is a perspective view which schematically depicts use of emitter 72 of the present invention for detecting transmissivity measurements for transmissive member 74. Transmissive member may be either transparent, or translucent. Transmissive member 74 receives infrared emissions and passes transmitted light 76, which is directed to detector 78. Measurements from detector 78 are then used for determining the transmissivity for transmissive member 74.

Figure 17:
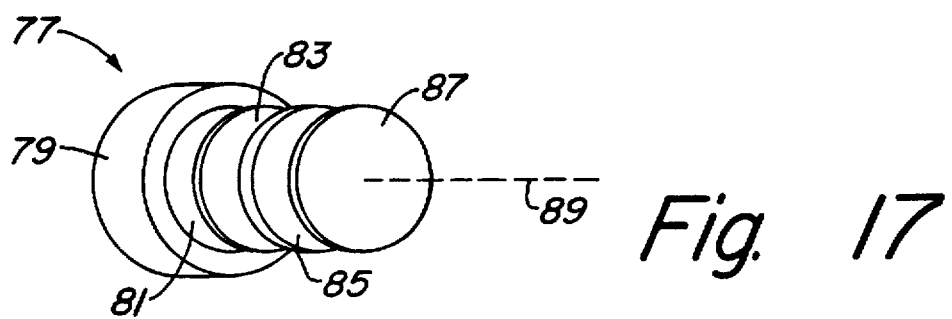
FIG. 17 is an exploded view of a monochromatic laser like source provided by the present invention.

FIG. 17 is an exploded view depicting monochromatic laser like emitter unit 77 constructed according to the present invention. Monochromatic emitter unit 77 includes housing 79 within which heat source 81 is placed. Mirror 83 is placed against emitter member 85 and partially silvered mirror 87 provides a partially reflective surface for placing on the outer portion of emitter member 85. Mirror 83 is placed parallel to partially silvered mirror 87, and both mirror 83 and partially silvered mirror 87 are parallel to the parallel layers within emitter member 85. Heating of emitter member 85 will cause laser emissions 89 from monochromatic laser 77.

Figure 18:
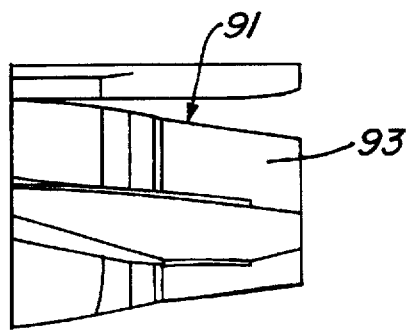
FIG. 18 is a schematic view of a tail section of a jet engine for an aircraft.

FIG. 18 is a schematic view depicting hot tail section 91 of a jet engine for a jet aircraft. Hot tail section 91 has portions 93 which are heated to high temperatures and emit infrared radiation.

Figure 19:
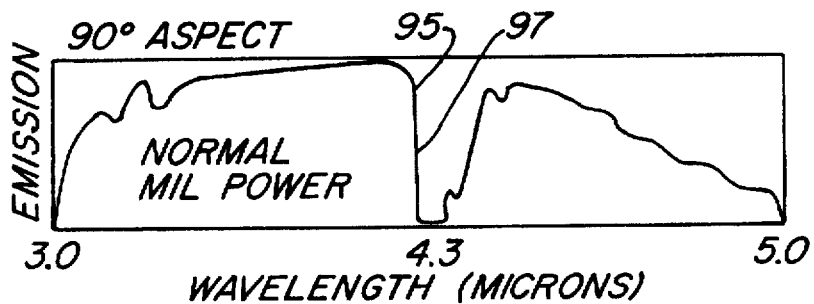
FIG. 19 is a graph depicting the infrared spectral emissions from the tail section of FIG. 18.

FIG. 19 is a graph depicting the infrared spectral emissions 95 from heated portion 93 of tail section 91 of FIG. 18.

It should be noted that a dip 97 occurs within the spectral emissions at an atmospheric absorption region at a wavelength of 4.3 microns, which corresponds to the infrared absorption of $CO_2$ within the atmosphere.

Figure 20:
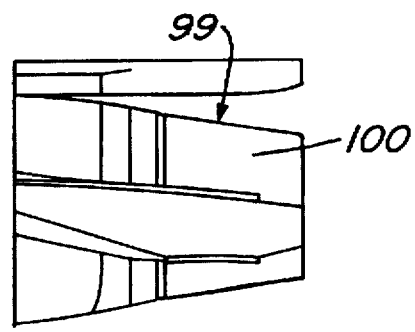
FIG. 20 depicts a tail section of a jet engine for an aircraft, showing the tail section coated with an emitter member of the present invention.

FIG. 20 depicts jet engine tail section 99 after an emitter member 100 of the present invention has been applied as a surface coating. Emitter member 100 can be provided to have layers of a particular thickness which correspond to a wavelength for infrared emissions having 4.2 microns, which again corresponds to the $CO_2$ region for atmospheric absorption of infrared radiation.

Figure 21:
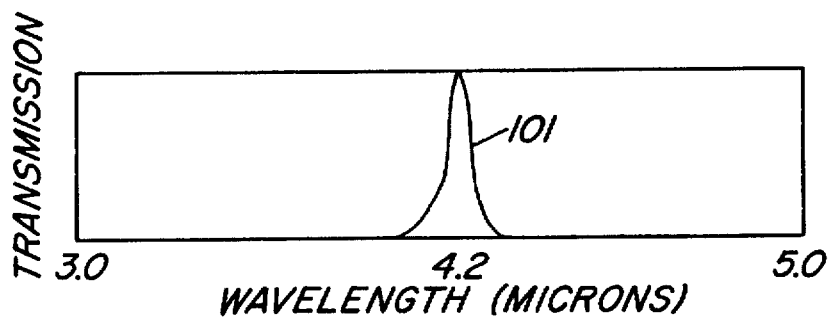
FIG. 21 is a graph depicting infrared spectral emissions from the emitter member coating the tail section of FIG. 20.

FIG. 21 depicts spectral peak 101 of the emitter member at which infrared radiation is emitted from emitter member 100 of FIG. 20. Spectral peak 101 is emitted from the emitter member 100 coated onto tail section 99 of FIG. 20, and is selected to occur at a wavelength of 4.2 microns.

Figure 22:
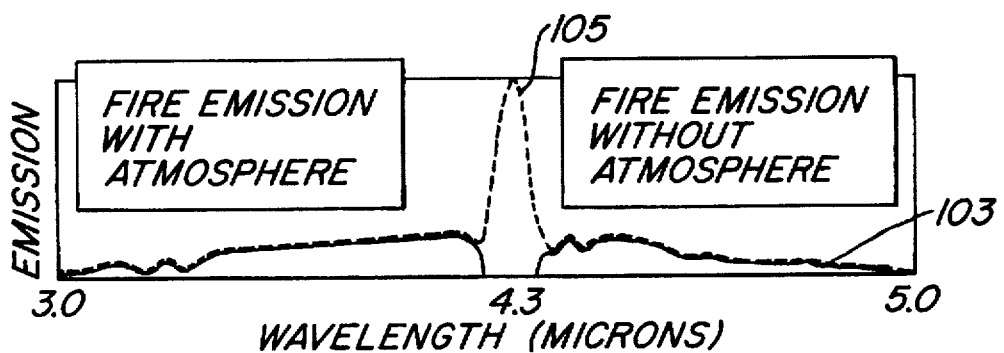
FIG. 22 is a graph depicting the spectral emissions from the tail section of FIG. 20 over a portion of the infrared spectrum.

FIG. 22 is a graph of spectral emissions depicting emissions 103 from tail section 99 of FIG. 14, actual emissions. Spectral peak 105 at a wavelength of 4.3 microns is depicted as a dashed line, and shows the actual emissions at the surface of tail section 19. Lower portion 107 depicts the emissions after absorption of the spectral peak at a wavelength of 4.3 microns by the $CO_2$ within the earth's atmosphere. Thus, the resulting spectral emissions 103 are at a much lower level as compared to the spectral emissions of FIG. 19, without emitter member 100 being coated onto heated portion 93 of tail section 91.

Figure 23:
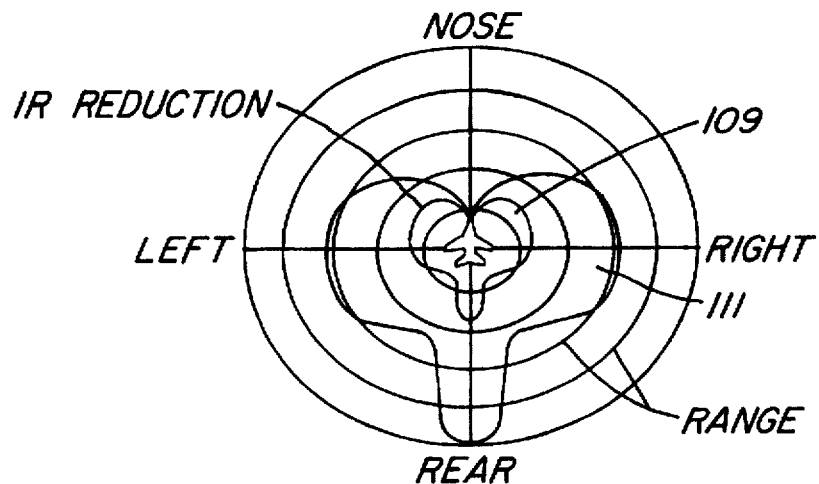
FIG. 23 is a diagram illustrating a comparison for missile detection profiles in the infrared spectrum to compare the infrared emissions from the uncoated tail section of FIG. 18 with the infrared emissions from the coated tail section of FIG. 20.

Referring to FIG. 23, a schematic diagram compares detection profile between infrared profile 109 for an infrared targeting system looking at the detection profile for a hot tail section according to FIG. 20 as compared to an infrared profile 111 for a tail section according to FIG. 18. Detection profile 111 illustrates the range at which a targeting system can track a jet aircraft which does not have the tail section coating with the emitter member of the present invention. Detection profile 109 depicts the range at which an infrared targeting system can track a jet aircraft having the tail section coated with an emitter member of the present invention, such as tail section 99 of FIG. 20. Thus, infrared targeting systems, such as for heat seeking missiles, have much less range on acquiring a jet aircraft having hot members, or tail sections, coated with an emitter member of the present invention.

Figure 24:
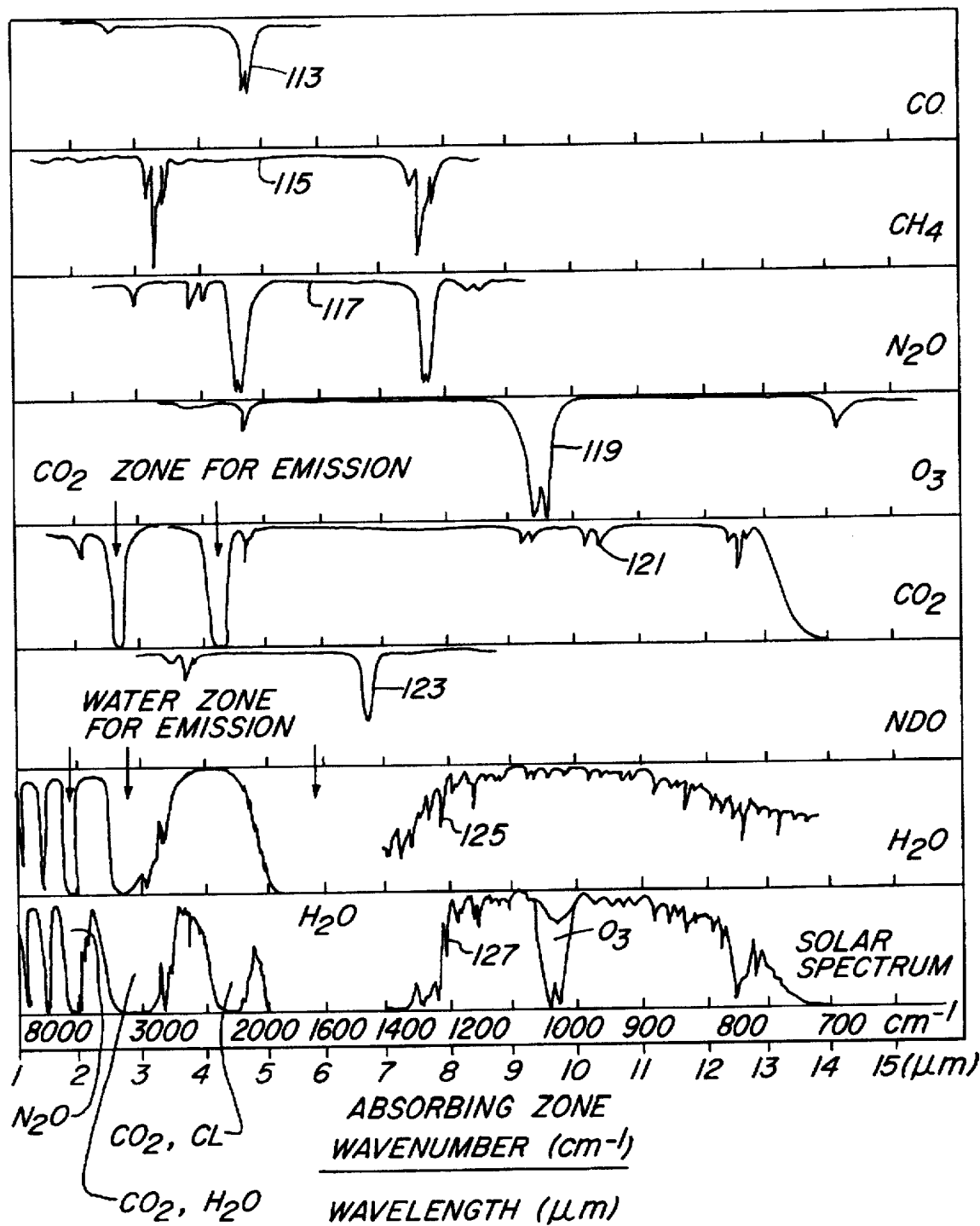
FIG. 24 depicts different atmospheric absorption regions for different energy levels within the infrared spectrum.

FIG. 24 depicts the wavelengths of absorption for various atmospheric absorption regions, or zones, defined by different components of the atmosphere. It should be noted that various wavelengths can be selected for providing coatings having thicknesses, typically of one-quarter wavelength, for emitting infrared radiation in that zone rather than at different wavelengths which are not within an atmospheric absorption zone. Curve 113 corresponds to carbon monoxide, curve 115 corresponds to methane, curve 117 corresponds to nitrous oxide, curve 119 corresponds to ozone, curve 121 corresponds to carbon dioxide, curve 123 corresponds to NDO, curve 125 corresponds to water, and curve 127 corresponds to a multiplicity of the above elements within the atmosphere. The coating of the present invention can be placed on a tail section of a jet aircraft to have varying thicknesses equal to one-quarter of the wavelength for the different zones within which spectral emissions are desired to correspond to atmospheric absorption zones.

Referring again to FIG. 1, emitter member 13 may be applied to a surface, which may be represented as energy source 15. Surface 15 may be an exterior metal surface of a tank, or another type of battlefield armored member. At ambient temperatures, surface 15 may absorb heat, such as from the sun, and emit infrared light at wavelengths of slightly elevated temperatures from background surroundings. If surface 15 is a heat emitting surface, it will provide an infrared emission signature which be used for targeting the tank. At such slightly elevated temperatures, emitter member 13 may be provided with a structure having layers separated by widths which provide for infrared emissions at a selected wavelength at that slightly elevated temperature, such as wavelengths corresponding to an atmospheric absorption zone. Thus, the infrared signature for targeting the tank will not be emitted for acquisition by infrared targeting systems. Thus, surface 15 may be cloaked from detection by infrared targeting systems by coating surface 16 with emitter member 13.

Figure 25:
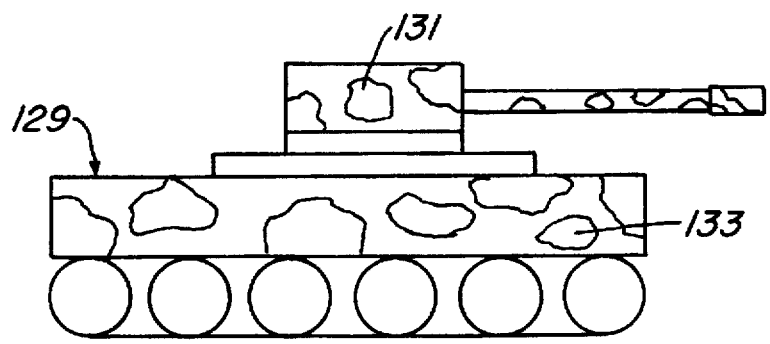
FIG. 25 is a perspective view of a piece of battlefield equipment according to the present invention, which comprises a tank having camouflaged infrared emissions.

FIG. 25 is a perspective view of a piece of battlefield equipment 129 made according to the present invention. Piece 129 is depicted as a tank having infrared emitting surface 131 on which an emitter member 133 of the present invention is selectively coated. In this preferred embodiment, emitter member 133 is applied only to selected portions of tank 129 to provide camouflage for light emissions in the infrared spectrum. It should be noted that in other embodiments of the present invention, other patterns may be provided. Further, the present invention contemplates that all of the exterior surfaces of tank 129 may be coated with emitter member 133, or an entire selected directional portion may be coated such as all upwardly facing surfaces, or all forward facing surfaces.

It should also be noted that heat source 15 of FIG. 1 may also represent clothing and other gear either worn or carried by military personnel. As such, emitter member 13 coated thereon will reduce infrared emission at the spectral wavelength which are not within an atmospheric absorption zone to cloak military personnel from detection and targeting by infrared detection and targeting systems. Further, weapons carried by such personnel may be coated with emitter member 13 to prevent detection.

Figure 26:
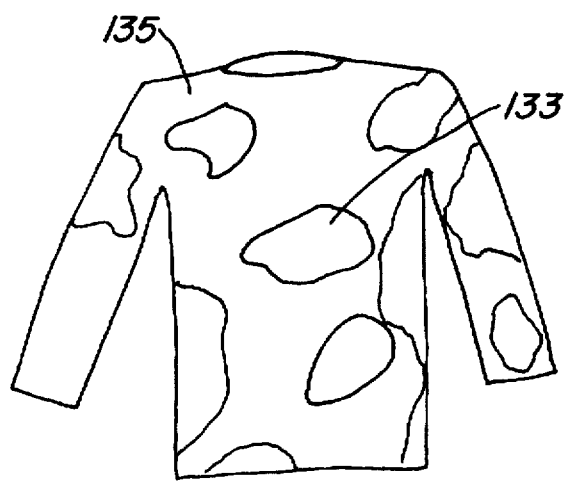
FIG. 26 is a perspective view of a piece of battlefield equipment according to the present invention, which comprises an article of clothing for military personnel having camouflaged infrared emissions.

FIG. 26 is a perspective view of piece of battlefield equipment 135, made according to the present invention. Piece 135 is an article of clothing for military personnel having camouflaged infrared emissions. Emitter member 133 of the present invention is selectively coated onto selected portions of the exterior surface of article 135 to provide camouflage for light emissions in the infrared spectrum. It should be noted that in other embodiments of the present invention, other patterns may be provided. Further, the present invention contemplates that all of the exterior surfaces of article of clothing 135 may be coated with emitter member 133. Further, the present invention may be used for coating other portions of equipment, such as gloves, helmets, face shields, and fire arms.

The present invention provides several advantages over the prior art. Members having light emitting surfaces which provide infrared signatures for detection and targeting may be coated with an emitter member of the present invention to prevent detection of such members. A selected wavelength may be emitted which is absorbed by components of the atmosphere. Light emitted at other portions of the infrared spectrum will not be emitted by the emitter member of the present invention.

Further, the present invention may be used to provide inexpensive calibration devices for emitting light at selected wavelengths for calibrating infrared detectors. Additionally, infrared emissions at the selected wavelengths may be used for determining the reflectance of surfaces. Reflectance measurements may be used to determine the roughness of surfaces, and even the types of coating materials applied to such surfaces. The present invention may also used for determining the transmissivity of a transmissive substance, from which properties of the transmissive substance can be determined.

Although the invention has been described with reference to specific embodiments, this description is not meant to be construed in a limiting sense. Various modifications of the disclosed embodiments as well as other alternative embodiments of the invention will become apparent to persons skilled in the art upon reference to the description of the invention. It is therefore contemplated that the appended claims will cover any such modifications or embodiments that fall within the true scope of the invention.

I claim:

1. An apparatus for emitting light at a selected wavelength, the apparatus comprising:

an emitter member having a forward side, a rearward side, and a plurality of layers which have selected optical thicknesses and which are overlaid with one another on a substrate, wherein alternating ones of the layers are comprised of materials having different indexes of refraction to provide alternating layers having different indexes of refraction;

heat source means for heating the emitter member to a sufficient temperature for stimulating photon emissions within the emitter member, wherein energy levels for the photon emissions are determined by the composition of the emitter member;

the emitter member emits light at the selected wavelength in response to the photon emissions, and the selected wavelength at which the light is emitted is determined by the optical thicknesses of the layers;

a partially reflective surface on the forward side of the emitter member and facing rearward;

a reflective surface in substantially parallel alignment with the partially reflective surface and located on the rearward side of the emitter member and facing forward; and wherein light created within the emitter reflects back and forth between the partially reflective surface and the reflective surface and creates a near monochromatic light emission through the partially reflective surface in a forward direction.

2. The apparatus according to claim 1, wherein the emitter has a forward face through which the light is emitted;

wherein the optical thicknesses of each of the layers increases in an angular direction about a longitudinal axis passing through and normal to the forward face, and wherein the apparatus further comprises:

a disk on the forward face mounted for rotation relative to the forward face, the disk having a slot therethrough for passing a beam of the light; and wherein rotating the disk from one angular position to another changes the wavelength of the light beam due to the different widths of the layers.

3. The apparatus according to claim 1, wherein the layers of the emitter member are comprised of alternating layers of germanium and silicon oxide.

4. An apparatus for emitting light at a selected wavelength, the apparatus comprising:

an emitter member having a plurality of layers which have selected optical thicknesses and which are overlaid with one another on a substrate, wherein alternating ones of the layers are comprised of materials having different indexes of refraction to provide alternating layers having different indexes of refraction;

heat source means for heating the emitter member to a sufficient temperature for stimulating photon emissions within the emitter member, wherein energy levels for the photon emissions are determined by the composition of the emitter member;

the emitter member emits light at the selected wavelength in response to the photon emissions, and the selected wavelength at which the light is emitted is determined by the optical thicknesses of the layers;

the substrate of the emitter member comprises a skin surface of a military vehicle, and the layers are coated on the skin surface;

the heat source means comprises a power supply for the vehicle which heats the emitter for stimulating the photon emissions; and the selected wavelength is within an atmospheric absorption zone to reduce detection of the military vehicle by infrared detection systems.

5. An apparatus for emitting light at a selected wavelength, the apparatus comprising:

an emitter member having a plurality of layers which have selected optical thicknesses and which are overlaid with one another on a substrate, wherein alternating ones of the layers are comprised of materials having different indexes of refraction to provide alternating layers having different indexes of refraction;

heat source means for heating the emitter member to a sufficient temperature for stimulating photon emissions within the emitter member, wherein energy levels for the photon emissions are determined by the composition of the emitter member; and wherein the emitter member emits light at the selected wavelength in response to the photon emissions, and the selected wavelength at which the light is emitted is determined by the optical thicknesses of the layers;

the emitter member has a forward face through which the light is emitted;

the substrate of the emitter member comprises a skin surface of a military vehicle, and the layers are coated on the skin surface;

the heat source means comprises a power supply for the military vehicle which heats the emitter for stimulating the photon emissions; and the selected wavelength is within an atmospheric absorption zone to reduce detection of the military vehicle hardware by infrared detection systems.

6. An apparatus for reducing infrared light emissions from a light emitting substrate when heated, the apparatus comprising:

a plurality of overlaid layers coated on a substrate having optical thicknesses;

alternating ones of the layers having different indexes of refraction through the optical thicknesses between the overlaid layers;

the optical thicknesses being selected only to pass a wavelength of infrared light within an atmospheric absorption zone to reduce detection of the substrate by infrared detection systems; and wherein heating the substrate to a sufficient temperature for stimulating photon emissions within the substrate causes the layers to emit the light at the wavelength of the atmospheric absorption zone, with the optical thicknesses of the layers determining the wavelength of the light emitted.

7. The apparatus according to claim 6, wherein the substrate is the skin of a military vehicle.

8. The apparatus according to claim 6, wherein the substrate is a nozzle section of an airplane.

9. The apparatus according to claim 6, wherein the layers of the emitter member are comprised of alternating layers of germanium and silicon oxide.

10. The apparatus according to claim 6, wherein:

the substrate is a nozzle section of an airplane; and the layers of the emitter member are comprised of alternating layers of germanium and silicon oxide.

11. A method for emitting light at a selected wavelength, the method comprising the steps of:

providing an emitter member which includes a forward face and a plurality of layers which are overlaid with one on another on a substrate and which have selected optical thicknesses, with alternating ones of the layers having different indexes of refraction from adjacent layers;

heating the emitter member to a sufficient temperature for stimulating photon emissions within the emitter member;

wherein the photon emissions passing within the overlaid layers of the emitter member produce light which is emitted from a face of the emitter member at the selected wavelength, which is determined by the optical thicknesses of the overlaid layers;

disposing a reflective surface in parallel alignment with the parallel layers of the emitter member, aligned for receiving a first portion of the light from a backside of the emitter member;

disposing a partially reflective surface in parallel alignment with a face of the emitter member, which is opposite of the backside, and parallel to the reflector surface, wherein the partially reflective surface is aligned with the face for receiving a second portion of the emitted light from the face; and wherein heating the emitter member causes light beams in the layers to reflect between the partially reflective surface and the reflective surface, and when the energy level is sufficient, near monochromatic light emissions are transmitted through the partially reflective surface.

12. A method for emitting light at a selected wavelength, the method comprising the steps of:

providing an emitter member which includes a forward face and a plurality of layers which are overlaid with one on another on a skin portion of a military apparatus which is subjected to heat due to operation of the apparatus, and which have selected optical thicknesses, with alternating ones of the layers having different indexes of refraction from adjacent layers;

heating the emitter member to a sufficient temperature for stimulating photon emissions within the emitter member;

wherein the photon emissions passing within the overlaid layers of the emitter member produce light which is emitted from a face of the emitter member at the selected wavelength, which is determined by the optical thicknesses of the overlaid layers;

wherein the step of providing the layers comprise coating the layers on the skin; and wherein the optical thicknesses of the layers are selected for emitting the light at a wavelength in an atmospheric absorption zone.

13. The method according to claim 12, wherein the skin portion of the military apparatus extends around a nozzle section of an aircraft.

14. The method according to claim 12, wherein the skin portion of the military apparatus houses a power supply which heats the skin portion.

* * * * *